(12) United States Patent
Fontius et al.

(10) Patent No.: US 6,864,682 B2
(45) Date of Patent: Mar. 8, 2005

(54) METHOD FOR VIBRATION COMPENSATION IN A MAGNETIC RESONANCE TOMOGRAPHY APPARATUS

(75) Inventors: Joerg Fontius, Neunkirchen (DE); Volker Weissenberger, Moehrendorf (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/438,588

(22) Filed: May 15, 2003

(65) Prior Publication Data

US 2004/0032260 A1 Feb. 19, 2004

(30) Foreign Application Priority Data

May 15, 2002 (DE) .......................................... 102 21 640

(51) Int. Cl.[7] .................................................. G01V 3/00
(52) U.S. Cl. ....................................................... 324/309
(58) Field of Search ................................ 324/307–309, 324/314, 318–320, 322; 600/410

(56) References Cited

U.S. PATENT DOCUMENTS

| | | | |
|---|---|---|---|
| 4,535,595 A | | 8/1985 | Keller et al. |
| 4,949,044 A | * | 8/1990 | Starewicz et al. .......... 324/320 |
| 5,617,029 A | | 4/1997 | Schneider |
| 5,917,323 A | * | 6/1999 | Du et al. .................... 324/309 |
| 6,025,715 A | | 2/2000 | King et al. |
| 6,329,821 B1 | * | 12/2001 | Zhou .......................... 324/318 |
| 6,380,738 B1 | * | 4/2002 | Zhou .......................... 324/309 |
| 6,489,765 B2 | * | 12/2002 | Goto ........................... 324/307 |
| 6,504,373 B2 | * | 1/2003 | Tsuda ......................... 324/322 |
| 6,507,190 B1 | * | 1/2003 | Hinks et al. ................ 324/307 |

FOREIGN PATENT DOCUMENTS

DE 197 02 831 3/1998

* cited by examiner

Primary Examiner—Christopher W. Fulton
Assistant Examiner—Dixomara Vargas
(74) Attorney, Agent, or Firm—Schiff Hardin LLP

(57) ABSTRACT

In a method for the compensation of disturbances due to vibrations in a magnetic resonance tomography apparatus s having a cryo-head seated on a cryostat for cooling a superconducting magnet and having a compensation device for correcting the magnetic field fluctuations generated due to the vibrations of the cryo-head, the compensation device sets the synthesizer frequency and/or the gradient currents according to the time curve of the field terms of the $0^{th}$ and/or $1^{st}$ orders acquired in a tune-up.

8 Claims, 3 Drawing Sheets

METHOD FOR VIBRATION COMPENSATION IN A MAGNETIC RESONANCE TOMOGRAPHY APPARATUS

BACKGROUND OF THE INVENTION

1. Field of the Invention

The present invention is directed to a method for the compensation of disturbances due to vibrations in nuclear magnetic resonance tomography apparatus of the type having a cryo-head seated on a cryostat for cooling a superconducting magnet and having a compensation device for correcting the magnetic field fluctuations generated due to the vibrations of the cryo-head.

2. Description of the Prior Art

In a method disclosed in published U.S. application Ser. No. 2001/0013778 for the compensation of disturbances due to vibrations in a magnetic resonance tomography apparatus, magnetic field correction coils are provided that generate a correction field with an amplitude corresponding to the magnetic field variations that are caused by the mechanical vibrations triggered by the cryo-head, which is usually operated with helium. This compensation by means of separate correction coils is not only structurally complicated, but also the square-wave pulse drive provided for operating to coils enables only rough corrections since it only detects when the piston of the cryo-head begins a motion stroke in the one or other direction.

SUMMARY OF THE INVENTION

An object of the present invention is to provide a method of the type initially described that, with a simpler structure, enables significantly more exact compensations of the vibrational oscillations of the magnets caused by the cryo-head.

This object is achieved in accordance with the invention wherein the compensation device sets the synthesizer frequency and/or the gradient currents according to the time curve of field terms of the 0th and 1st orders acquired in a tune-up. Motion trigger pulses from the cryo-head can be used to assure the synchronization thereof with its vibrations.

It is assumed in a first embodiment of the invention that the motion of the cryo-head causes reproducible field disturbances, i.e. that every stroke of the piston of the cryo-machine generates the same vibrations, and thus the same field disturbance. Given this assumption, it suffices to measure the field fluctuations that arise due to the vibrations of the magnets during a piston cycle of the cryo-head in the tune-up. These then serve for generating a correction set of overlay signals for the synthesizer and the gradient currents. At most, the tune-up measurement must be repeated given a modified vibratory behavior of the cryo-head caused by aging.

In a second exemplary embodiment of the present invention wherein this assumption of a cryo-head always causing the same vibrations is not necessary, it is merely assumed that the system composed of the mechanical oscillations and the magnetic field behaves linearly in a first approximation and therefore can be described using linear response theory. Inventively, the vibrations of the cryo-head are measured at suitable locations with a force sensor or acceleration sensor during the entire time duration of the MR measurement, and the measured signals thereof are transformed with corresponding transfer functions for the $B_0$ field as well as for the $A(1,0)$, $A(1,1)$ and $B(1,1)$ terms and employed for the correction of the synthesizer frequency and of the gradient currents. It is assumed that every type of mechanical oscillation causes a specific field distortion in terms of frequency and amplitude, the transfer function being that function that describes the correlation between mechanical oscillations and magnetic field that can be described via a linear response theory.

The transfer function preferably is realized by filters and delay elements, the parameters of which are determined in a tune-up step. The parameters for the synthesizer and the three gradient axes are individually varied such that the disturbances of the field terms of the 0th and 1st orders identified with measuring probes become minimum. This optimization can ensue by means of manual variation of the parameters or computationally, for example by means of correlation between the signal of the acceleration sensor and the time curve of the field terms of the 0th order and 1st order.

The identified parameters are stored in the system and are employed for driving the filters and delay elements in an MR measurement. The delay elements are important because,—among other things,—a suitably modified time offset between the mechanical vibrations and the magnetic field disturbances occurs due to the arrangement of the force sensor or acceleration sensor at the cryostat. These must be correlated by corresponding delay elements in all cases.

In order to be able to measure the B0 field and the linear field terms of the gradient fields, in one embodiment of the invention a tune-up measuring instrument is used that contains four measuring probes. Some of these probes are arranged in the magnet isocenter and others are respectively arranged on one of the gradient axes. Each measuring probe can include a phantom member surrounded by an RF-coil. Via a phase evaluation, the time curve of the magnetic field at the probe locations can be measured with a suitable sequence, particularly a steady-state free precession sequence.

DESCRIPTION OF THE PREFERRED EMBODIMENTS

Figure 1:
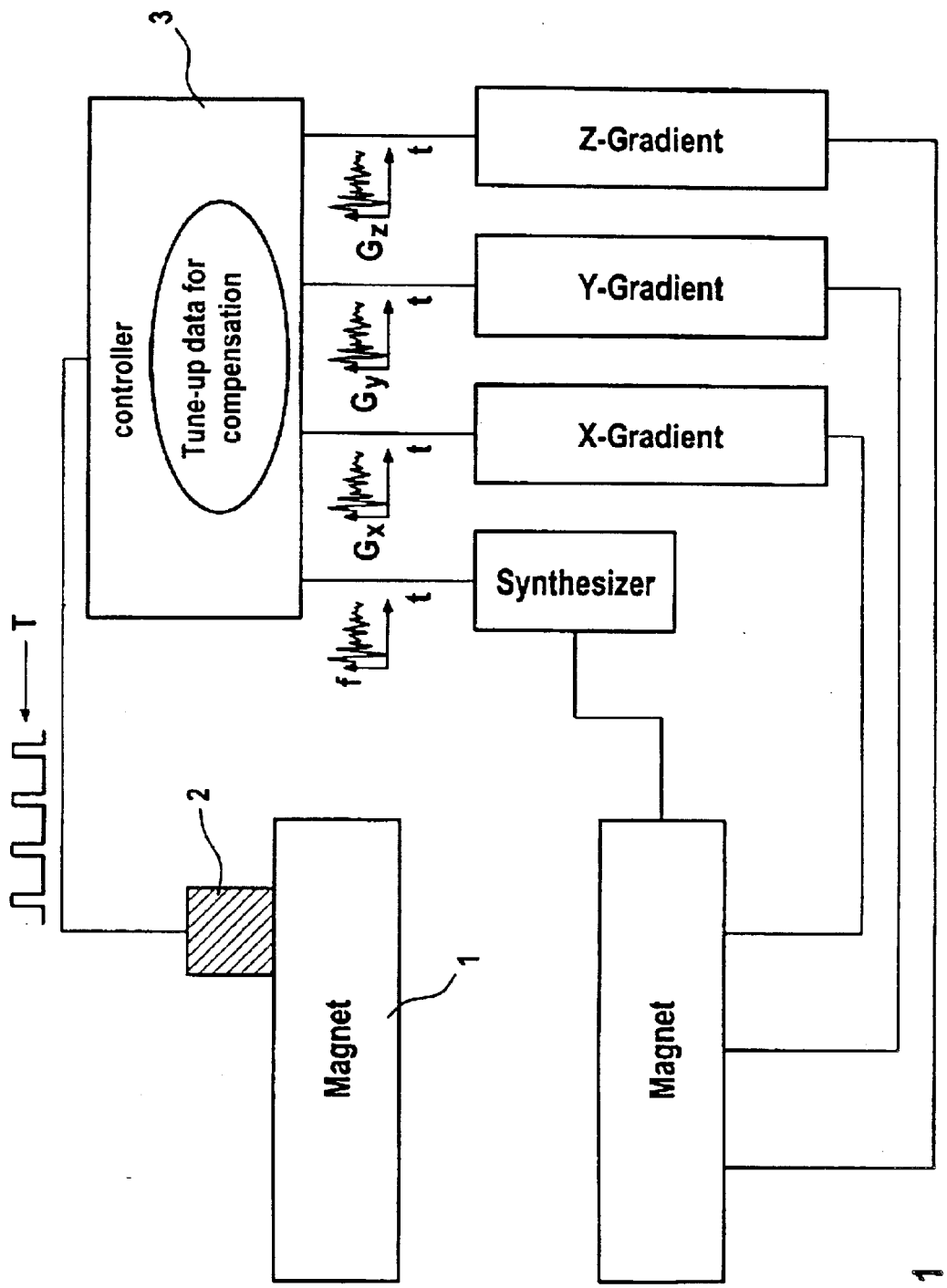
FIG. 1 is a schematic illustration of a first compensation method with triggering of the control by the cryo-head.

In the exemplary embodiment according to FIG. 1, the magnet 1 and the cryo-head 2 serving for cooling, (the external supply lines to the compressor or the like are not shown). The insulating housing of the cryostat is not shown since it does not enter into the explanation of the present invention. It is assumed in the compensation method shown in FIG. 1 that the motion of the cryo-head causes reproducible field disturbances, and the time curve of the field fluctuations of the terms of the $0^{th}$ and $1^{st}$ orders are therefore detected in a tune-up during only one piston cycle, as described in detail below on the basis of FIGS. 3 and 4.

With a trigger pulse t, the cryo-head 2 communicates the start of a new piston stroke to the controller 3 in which the previously measured tune-up data are stored for the compensation. The controller opposes the field disturbance arising as a consequence of the vibration by setting the synthesizer frequency as well as the gradient currents for the X-gradient, Y-gradient and Z-gradient according to the time curve of the field terms of the $0^{th}$ and $1^{st}$ order acquired in the tune-up. These are set with the operational sign needed for the compensation. This means the same operational sign given the synthesizer and opposite operational sign given the gradient currents. The tune-up measurement only has to be repeated as needed if a modified vibrational behavior of the cryo-head occurs, for example due to aging.

Figure 2:
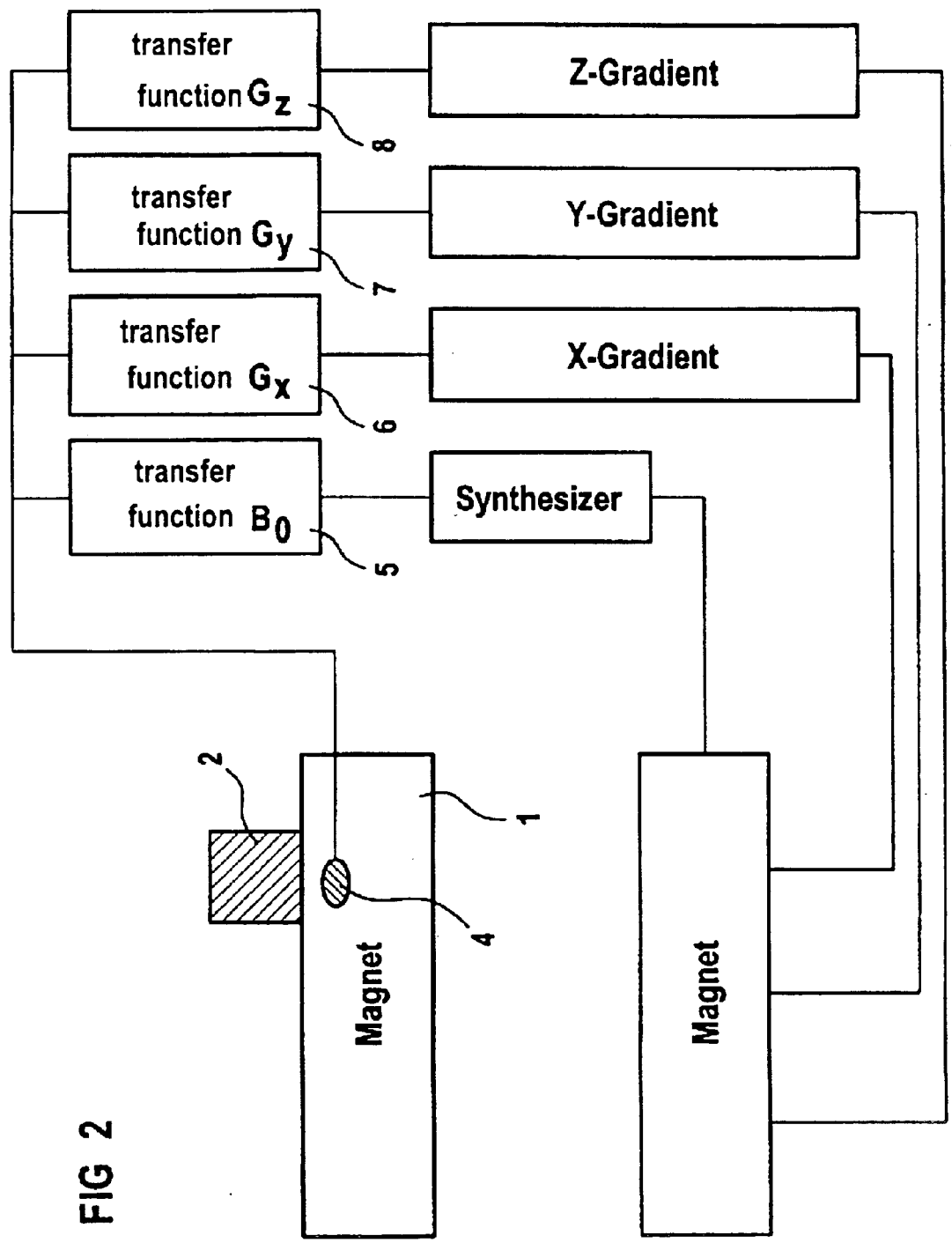
FIG. 2 is an illustration of a second embodiment of the inventive compensation method corresponding to FIG. 1 in terms of structure, but wherein the vibrations of the cryostat are constantly measured and serve for driving at least some components.

In the exemplary embodiment according to FIG. 2, an acceleration sensor 4, or possibly a number of acceleration sensors, which acquires the vibrations of the cryo-head or of the magnet during the entire time duration of the MR measurement, is arranged at a suitable location of the cryostat. Given the aforementioned assumption of a linear system, the signal of the acceleration sensor 4 is transformed with the corresponding transfer function for the $B_0$ field, the $A(1,0)$, $A(1,1)$ and $B(1,1)$ terms and is employed for the correction of the synthesizer frequency and of the three gradient currents. The corresponding transfer functions are realized by means of delay elements and filters 5 through 8, the parameters for the filters and delay elements being identified in a tune-up step that generally describes the correlation between mechanical movements at the cryostat and magnetic field disturbances of the field terms of the $0^{th}$ and $1^{st}$ orders.

Figure 3:
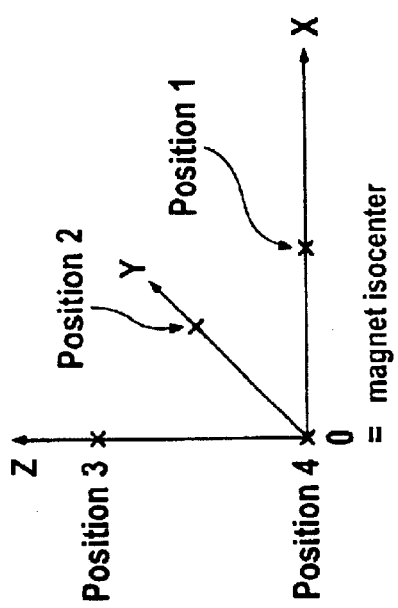
FIG. 3 is a diagram for illustrating the positions for determining the field terms of the 0th and 1st orders.

In order to be able to measure the $B_0$ field and the linear field terms, the field fluctuations must be measured with a probe at four spatial points in the magnetic field. The positions are shown in FIG. 3. The $B_0$ field change $B0(t)$ is measured at the central position 4. The terms of the $1^{st}$ order ($A(1,0)(t)$, $A(1,1)(t)$ and $B(1,1)$ $(t)$) are measured at the positions 1, 2 and 3 in combination with the result from position 4.

Figure 4:
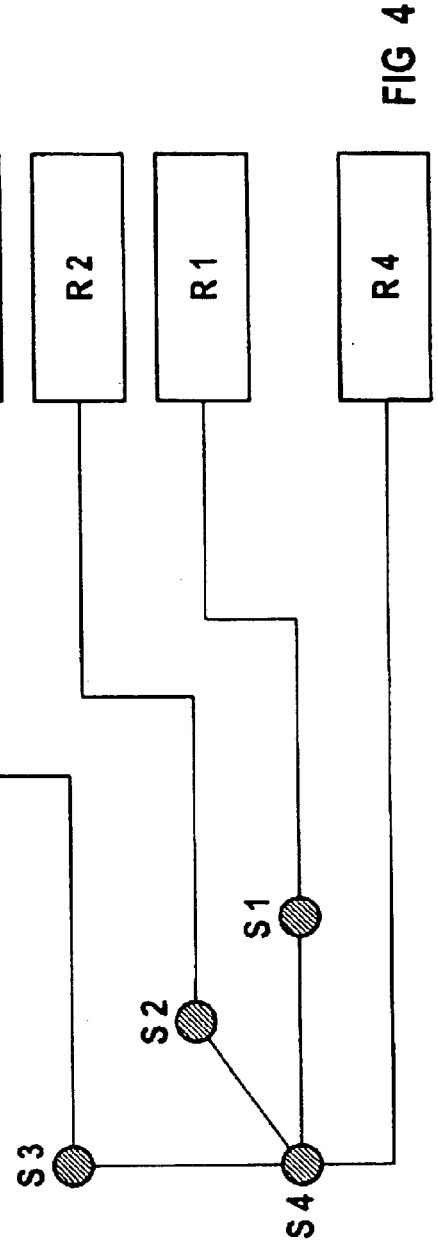
FIG. 4 shows an example of the structure of a tune-up measuring instrument having a number of measuring coils.

FIG. 4 shows an example of a tune-up measuring instrument having four measuring probes. The four measuring probes S1 through S4 are located at the positions shown in FIG. 3. The measured value acquisition ensues simultaneously with four reception channels, the receivers R1 through R4. As described above, the $B_0$ field fluctuations and the terms of the 1st order can thus be measured.

Each measuring probe S1 through S4 is composed of a small phantom member that is surrounded by a radio-frequency coil. The time curve of the magnetic field at the locations is measured by means of a phase evaluation a suitable sequence, for example a steady-state free precession sequence.

Despite the connected cryo-head, far fewer artifacts arise in the images due to the mechanical oscillations of the cryo-head as a result of the rather exact compensation of the disturbances with the inventive arrangement, whereby a much lower structural outlay is required compared to conventional compensation solutions, and the compensation of the disturbances that can be achieved is much greater.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance tomography apparatus having a superconducting magnet that generates a basic magnetic field, a cryo-head disposed on a cryostat and operable through a plurality of successive piston cycles for cooling said superconducting magnet, and a gradient system that generates gradient magnetic fields, said cryo-head producing vibrations that vibrate said superconducting magnet and said gradient system and thereby produce disturbances in at least one of said basic magnetic field and said gradient magnetic fields, a method for compensating for said disturbances in at least one of said basic magnetic field and said gradient magnetic fields comprising the steps of:

in a tune-up of said cryo-head operating said cryo-head through one of said piston cycles and determining at least one field term, selected from the group consisting of a zero order field term and a first order field term, in at least one of said basic magnetic field and said gradient fields, said at least one field term having a time curve associated therewith representing field disturbances caused by said vibrations of said cryo-head in said piston cycle; and during subsequent operation of said cryo-head, said superconducting and said gradient system, setting at least of a synthesizer frequency for operating said superconducting magnet, and gradient currents for operating said gradient system, dependent on said time curve to compensate for said disturbances.

2. A method as claimed in claim 1 comprising, during said subsequent operation, generating a trigger signal from said cryo-head at a beginning of each of said successive piston cycles, and repeating compensation for said disturbances upon each trigger signal.

3. In a magnetic resonance tomography apparatus having a superconducting magnet that generates a basic magnetic field, a cryo-head disposed on a cryostat and operable through a plurality of successive piston cycles for cooling said superconducting magnet, and a gradient system that generates gradient magnetic fields, said cryo-head producing vibrations that vibrate said superconducting magnet and said gradient system and thereby produce disturbances in at least one of said basic magnetic field and said gradient magnetic fields, a method for compensating for said disturbances in at least one of said basic magnetic field and said gradient magnetic fields comprising the steps of:

during operation of said cryo-head, said superconducting magnet and said gradient system, measuring said vibrations at a plurality of locations at said cryostat, as measured vibrations;

determining a transfer function representing a relationship between said measured vibrations and a time curve of at least one field term, selected from the group consisting of a zero order field term and a first order field term, in at least one of said basic magnetic field and said gradient fields; and from said measured vibrations and said transfer function, determining a corrected time curve for said at least one field term in at least one of said basic magnetic field and said gradient fields and, dependent on said corrected time curve, setting at least one of a synthesizer frequency for operating said superconducting magnet and gradient currents for operating said gradient system to compensate for said disturbances.

4. A method as claimed in claim 3 comprising measuring said vibrations at a plurality of locations at said cryostat with a force sensor during execution of a measurement with said magnetic resonance tomography apparatus, and thereby obtaining measured signals and transforming said measured signals with respective transfer functions for said basic magnetic field and for $A(1,0)$, $A(1,1)$ and $B(1,1)$ terms, to obtain correction signals and employing said correction signals for operating said synthesizer and said gradient system to compensate for said disturbances.

5. A method as claimed in claim 4 comprising generating said transfer functions with filters and delay elements having parameters determined in said tune-up.

6. A method as claimed in claim 4 comprising measuring said vibrations with a measuring instrument having four measuring probes, and disposing one of said measuring probes at an isocenter of said superconducting magnet and disposing three of said probes respectively along gradient axes of said gradient system in a Cartesian coordinate system.

7. A method as claimed in claim 6 comprising forming each measuring probe of a phantom member surrounded by an RF coil.

8. A method as claimed in claim 6 comprising subjecting said probes to a steady state-free precession sequence and phase-sensitively evaluating output signals from the respective probes to determine a time curve of a magnetic field in a vicinity of the probe.

* * * * *